(12) United States Patent
Tang et al.

(10) Patent No.: US 12,142,327 B2
(45) Date of Patent: Nov. 12, 2024

(54) MEMORY DEVICE CAPABLE OF REDUCING PROGRAM DISTURBANCE AND ERASING METHOD THEREOF

(71) Applicant: YANGTZE MEMORY TECHNOLOGIES CO., LTD., Wuhan (CN)

(72) Inventors: Qiang Tang, Wuhan (CN); Xiang Fu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 148 days.

(21) Appl. No.: 17/855,597

(22) Filed: Jun. 30, 2022

(65) Prior Publication Data

US 2022/0336026 A1 Oct. 20, 2022

Related U.S. Application Data

(63) Continuation-in-part of application No. 17/187,683, filed on Feb. 26, 2021, now Pat. No. 11,393,544,
(Continued)

(51) Int. Cl.
*G11C 16/00* (2006.01)
*G11C 16/08* (2006.01)
(Continued)

(52) U.S. Cl.
CPC .......... *G11C 16/3436* (2013.01); *G11C 16/08* (2013.01); *G11C 16/107* (2013.01);
(Continued)

(58) Field of Classification Search
CPC ..... G11C 16/0483; G11C 16/10; G11C 16/08; G11C 16/28; G11C 11/5628;
(Continued)

(56) References Cited

U.S. PATENT DOCUMENTS 10,559,368 B1 * 2/2020 Yang .................. G11C 16/08
10,998,063 B1 5/2021 Tang et al.
(Continued)

FOREIGN PATENT DOCUMENTS

CN 1538459 B 5/2010
CN 109119120 A 1/2019
(Continued)

OTHER PUBLICATIONS

Summons to attend oral proceedings pursuant to Rule 115(1) EPC issued in corresponding European Application No. 19 952 831. 6mailed on Apr. 26, 2024, 9 pages.

*Primary Examiner* — Thong Q Le
(74) *Attorney, Agent, or Firm* — BAYES PLLC

(57) ABSTRACT

A memory device includes a string of cells having one and more top selection cells, one or more dummy memory cells, and memory cells, and a peripheral circuit coupled to the string of cells. The peripheral circuit is configured to verify a threshold voltage of at least one of the one or more top selection cells or the one or more dummy memory cells to determine whether the at least one of the one or more top selection cells or the one or more dummy memory cells has failed. In response to the at least one of the one or more top selection cells or the one or more dummy memory cells being failed, the peripheral circuit is further configured to reset the at least one of the one or more top selection cells or the one or more dummy memory cells.

20 Claims, 12 Drawing Sheets

Related U.S. Application Data which is a continuation of application No. 16/726,802, filed on Dec. 24, 2019, now Pat. No. 10,998,063, which is a continuation of application No. PCT/CN2019/118332, filed on Nov. 14, 2019.

(51) Int. Cl.
*G11C 16/10* (2006.01)
*G11C 16/14* (2006.01)
*G11C 16/28* (2006.01)
*G11C 16/34* (2006.01)
*G11C 29/44* (2006.01)

(52) U.S. Cl.
CPC .............. *G11C 16/14* (2013.01); *G11C 16/28* (2013.01); *G11C 29/44* (2013.01)

(58) Field of Classification Search
CPC ........ G11C 16/3427; G11C 2211/5621; G11C 16/107; G11C 16/14; G11C 16/3436; G11C 29/44; G11C 11/5635; G11C 16/16; G11C 16/3472; G11C 16/0491; G11C 16/24; G11C 16/3404; G11C 16/3459; G11C 16/3418; G11C 11/5671; G11C 16/26; G11C 16/32; G11C 27/024; G11C 5/025; G11C 7/12; G11C 8/08; G11C 29/24; G11C 29/50004; G11C 29/52

See application file for complete search history.

(56) References Cited

U.S. PATENT DOCUMENTS

| | | |
|---|---|---|
| 2006/0239077 A1 | 10/2006 | Park et al. |
| 2008/0291737 A1 | 11/2008 | Moon et al. |
| 2014/0369129 A1 | 12/2014 | Dutta |
| 2016/0260489 A1 | 9/2016 | Lee |
| 2017/0140829 A1 | 5/2017 | Park et al. |
| 2017/0256320 A1 | 9/2017 | Lang et al. |
| 2018/0068726 A1 | 3/2018 | Song |
| 2018/0144802 A1 | 5/2018 | Choi et al. |
| 2018/0308550 A1 | 10/2018 | Shiino et al. |
| 2020/0020404 A1 | 1/2020 | Kim |

FOREIGN PATENT DOCUMENTS

| | | |
|---|---|---|
| CN | 109949835 A | 6/2019 |
| KR | 10-2013-0142461 A | 12/2013 |
| KR | 10-2018-0057260 A | 5/2018 |
| TW | 200509136 | 3/2005 |
| TW | 200603169 | 1/2006 |
| TW | 200715293 | 4/2007 |
| TW | 200717526 | 5/2007 |
| TW | 201027538 A1 | 7/2010 |

* cited by examiner

MEMORY DEVICE CAPABLE OF REDUCING PROGRAM DISTURBANCE AND ERASING METHOD THEREOF

CROSS-REFERENCE TO RELATED APPLICATIONS

This application is a continuation-in-part of U.S. application Ser. No. 17/187,683, filed on Feb. 26, 2021, which is a continuation of U.S. application Ser. No. 16/726,802, filed Dec. 24, 2019, which is a continuation of International Application No. PCT/CN2019/118332, filed Nov. 14, 2019, all contents of which are incorporated herein by reference in their entireties.

BACKGROUND

The present disclosure relates to a memory device, and in particular, to a memory device capable of reducing program disturbance and an erasing method thereof.

As technology advances, high-density memory cells have been incorporated into semiconductor memory devices to reduce overall device sizes and increase data storage capabilities. Nevertheless, the increase in integration density may lead to an increase in coupling between memory cells, and an unselected memory cell may be inadvertently programmed. The unintentional programming of the unselected memory cell is referred to as "program disturbance."

SUMMARY

In one embodiment, a memory device includes a string of memory cells, a plurality of special word lines, a plurality of main word lines, and a peripheral circuit. The string of memory cells includes a plurality of special memory cells and a plurality of main memory cells. The plurality of special memory cells are coupled in series, arranged at one end of the string of memory cells, and not for storing data. The plurality of main memory cells are for storing data and coupled in series. One of the plurality of main memory cells is coupled to one of the plurality of special memory cells. The plurality of special word lines are coupled to the plurality of special memory cells, respectively. The plurality of main word lines are coupled to the plurality of main memory cells, respectively. The peripheral circuit may be coupled to the plurality of special word lines and the plurality of word lines and used to verify if at least one special memory cell of the plurality of special memory cells has failed, reset the at least one special memory cell if the at least one special memory cell has failed, and erase the plurality of main memory cells.

In another embodiment, an erasing method is adopted in a memory device. The memory device includes a string of memory cells and a peripheral circuit. The string of memory cells includes a plurality of special memory cells not for storing data and a plurality of main memory cells for storing data. The erasing method includes: the peripheral circuit verifying if at least one special memory cell of the plurality of special memory cells has failed; the peripheral circuit resetting the at least one special memory cell if the at least one special memory cell has failed; and the peripheral circuit erasing the plurality of main memory cells.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate some implementations of the present disclosure and, together with the description, further serve to explain the principles of the present disclosure and to enable a person skilled in the pertinent art to make and use the present disclosure.

Figure 1:
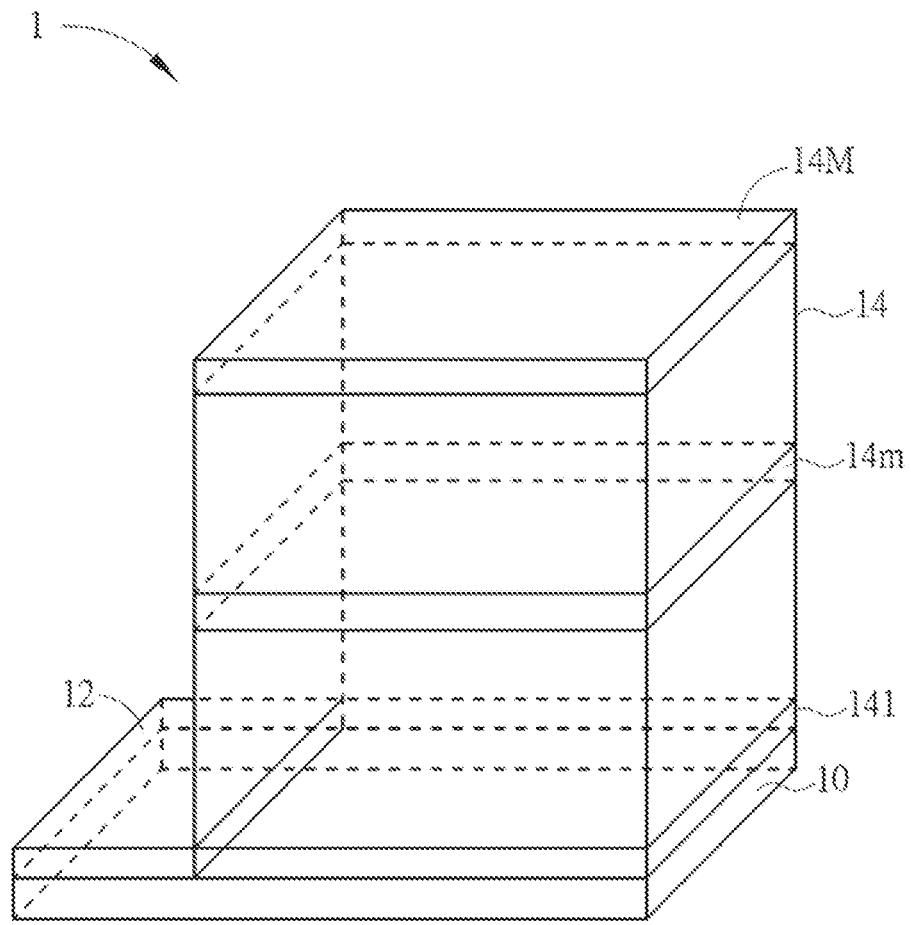
FIG. 1 illustrates a perspective view of a memory device, according to some implementations of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. In addition, the present disclosure can also be employed in a variety of other applications.

Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the terms "based on" and "according to" may be understood as not necessarily intended to convey an exclusive set of factors and may, instead, allow for the existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "three-dimensional (3D) memory device" may be used to refer to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means perpendicular to the lateral surface of a substrate.

Due to the high-density cell integration, the memory devices, such as 3D NAND memory devices, can suffer certain reliability issues. For example, floating gate coupling between the memory cells becomes a serious parasitic problem and can lead to a wide threshold voltage distribution. As a result, it may adversely cause an unselected memory cell to be programmed. In addition, the program/erase cycling may also cause the shift/drift of the threshold voltages of special memory cells (may include dummy memory cells and top selection cells) and regular memory cells. The threshold voltage shift/drift can be a cause of the program disturbance.

Known approaches to ensure that the threshold voltage is under control may include determining a block as a bad block when the threshold voltage shift occurs. By labeling the block failure, however, the number of program/erase cycling may be negatively impacted. In some approaches, a high bias voltage may be applied in an erasing operation to tune the shifted threshold voltage back. The high voltage, however, can damage the dummy memory cells and increase the chance of breakdown at dummy word lines. In addition, the biasing requirements can defer the time for a product to be released to the market.

To address the aforementioned and other issues, the present disclosure introduces one or more solutions in which once the threshold voltages are believed to be out of the suitable range, a reset operation may be performed to refresh the special memory cells. As a result, the biasing operations can be relaxed, and the time to market may be accordingly reduced.

FIG. 1 is a perspective view of a memory device 1, according to some implementations of the present disclosure. The memory device 1 may be a 3-dimensional (3D) NAND flash device that may include a substrate 10, a peripheral circuit 12, and a memory circuit 14. In some implementations, the peripheral circuit 12 and the memory circuit 14 may be disposed on the substrate 10. The memory circuit 14 may contain a plurality of cell arrays 141 to 14M stacked in layers and configured for data storage, where M can be a positive integer. In some implementations, the peripheral circuit 12 may be coupled to the memory circuit 14 to control reading, programming and/or erasing operations of the memory circuit 14 and may communicate with an external host (not shown) to receive data for storage in the memory circuit 14 and to transmit data fetched from the memory circuit 14.

Figure 2A:
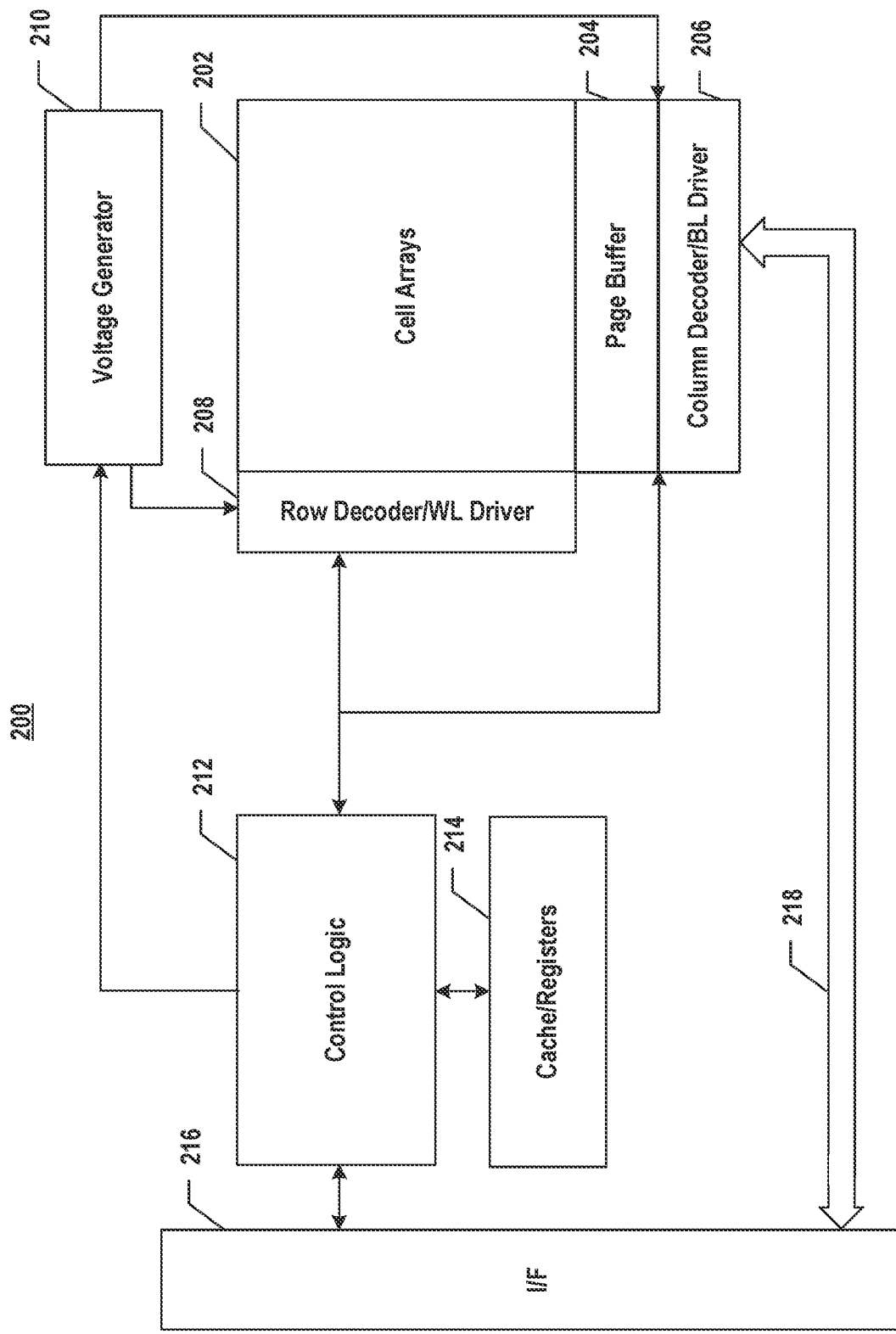
FIG. 2A illustrates a block diagram of an exemplary memory device, including cell arrays and a peripheral circuit, according to some implementations of the present disclosure.

FIG. 2A illustrates a block diagram of an exemplary memory device 200 in FIG. 1, including cell arrays 202 and a peripheral circuit, according to some implementations of the present disclosure. Cell arrays 202 can be equivalent to the cell arrays 141 to 14M shown in FIG. 1. As shown in FIG. 2A, the peripheral circuit can be coupled to cell arrays 202, e.g., through bit lines, word lines, a source line (shown in FIG. 2B), etc. The peripheral circuit can include any suitable circuits for facilitating the operations of cell arrays 202 by applying and sensing voltage signals and/or current signals through the bit lines to and from each target memory cell through the word lines and/or the source lines. The peripheral circuit can include diverse types of circuitry formed using CMOS technologies. For example, FIG. 2A demonstrates some exemplary circuitry that may include a page buffer 204, a column decoder/bit line driver 206, a row decoder/word line driver 208, a voltage generator 210, a control logic 212, cache/registers 214, an interface (I/F) 216, and a data bus 218. It is understood that in some examples, additional circuits may be included as well, such as a sensing amplifier.

Page buffer 204 can be configured to buffer data read from or programmed to cell arrays 202 according to control signals of control logic 212. In one example, page buffer 204 may store one page of program data (write data) to be programmed into one page of cell arrays 202. In another example, page buffer 204 may also perform program verify operations to ensure that the data has been properly programmed into memory cells coupled to selected word lines.

Row decoder/word line driver 208 can be configured to be controlled by control logic 212 to select a block (or termed "a cell array") of cell arrays 202 and a word line of the selected block. Row decoder/word line driver 208 can be further configured to drive cell arrays 202. For example, row decoder/word line driver 208 may drive memory cells coupled to the selected word line using a word line voltage generated from voltage generator 210.

Column decoder/bit line driver 206 can be configured to be controlled by control logic 212 to select one or more memory strings by applying bit line voltages generated from voltage generator 210. For example, column decoder/bit line driver 206 may apply column signals for selecting a set of N bits of data from page buffer 204 to be outputted in a read operation.

Control logic 212 can also be part of the peripheral circuit and configured to control operations of the peripheral circuit. Cache/registers 214 can be coupled to control logic 212 and may include status registers, command registers, and address registers for storing status information, command operation codes (OP codes), and command addresses for controlling the operations of the peripheral circuit.

Interface 216 can be coupled to control logic 212 and configured to interface cell arrays 202 with a memory controller (not shown). In some implementations, interface 216 may function as a control buffer to buffer and relay control commands received from the memory controller and/or a host (not shown) to control logic 212 and status information received from control logic 212 to the memory controller and/or the host. Interface 216 can also be coupled to page buffer 204 and column decoder/bit line driver 206 via data bus 218 and act as an I/O interface and a data buffer to buffer and relay the program data received from the memory controller and/or the host to page buffer 204 and the read data from page buffer 204 to the memory controller and/or the host. In some implementations, interface 216 and data bus 218 can be parts of an I/O circuit of the peripheral circuit.

Voltage generator 210 can be configured to be controlled by control logic 212 and generate the word line voltages (e.g., read voltage, program voltage, pass voltage, local voltage, and verification voltage), the bit line voltages, and other voltages to be supplied to cell arrays 202. In some implementations, voltage generator 210 can be part of a voltage source that provides voltages at various levels of different peripheral circuitry as described below in detail.

Consistent with the scope of the present disclosure, in some implementations, the voltages provided by voltage generator 210, for example, to row decoder/word line driver 208, column decoder/bit line driver 206, and page buffer 204 are above certain levels that are sufficient to perform the memory operations. Further, in accordance with the scope of the present disclosure, in some implementations, voltage generator 210 may produce the verification voltage configured to verify the threshold voltage of the special memory cells and/or the main memory cells and further to determine whether at least one of the special memory cells has failed. In some implementations, voltage generator 210 may also be configured to generate various voltages for the reset operation.

Figure 2B:
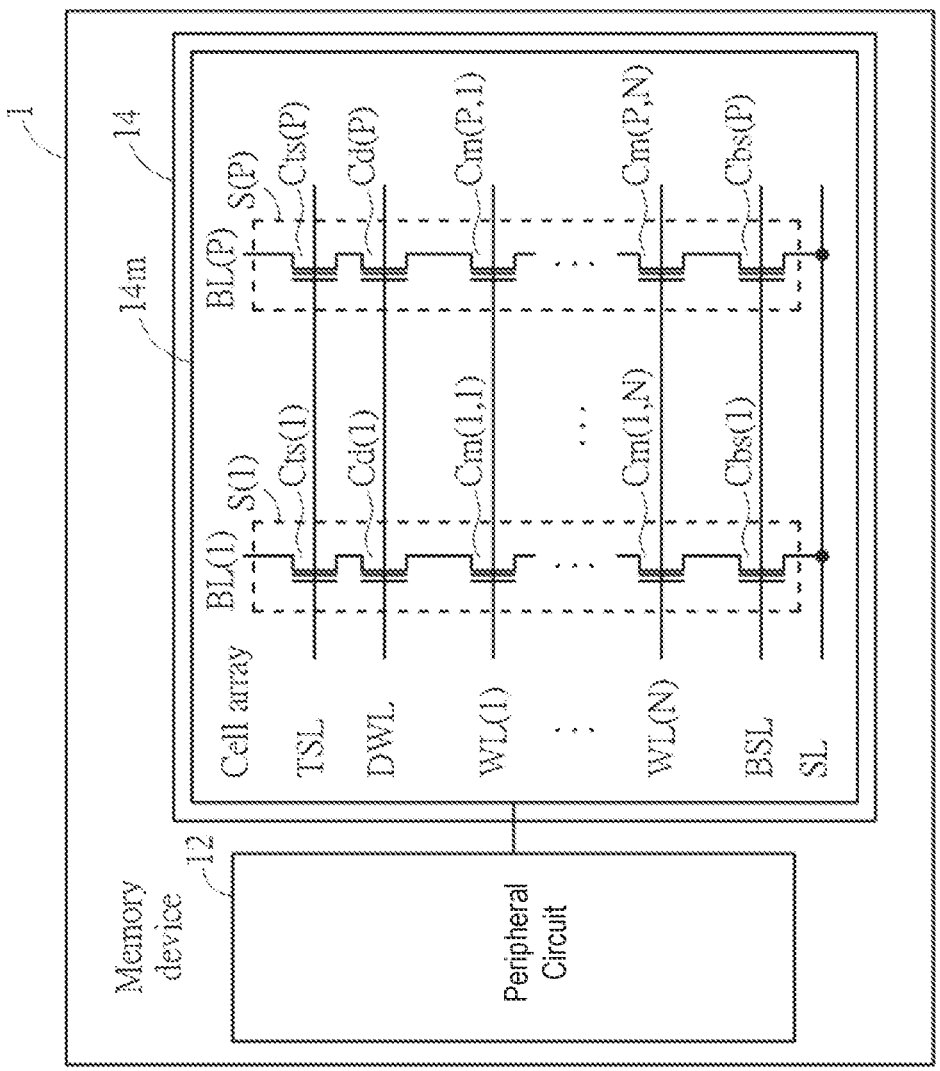
FIG. 2B illustrates a block diagram of another exemplary memory device, according to some implementations of the present disclosure.

FIG. 2B is a block diagram of another exemplary memory device 1, according to some implementations of the present disclosure. The memory device 1 may include a top selection line TSL, a dummy word line DWL, word lines WL(1) to WL(N), a bottom selection line BSL, a source line SL, bit lines BL(1) to BL(P), the peripheral circuit 12, and the memory circuit 14 including a plurality of cell arrays 141 to 14M where only the cell array 14$m$ is shown in FIG. 2B while the others are omitted. N and P may be positive integers, e.g., N=64 and P=8192, and m may be a positive integer and m≤M. In the present disclosure, the top selection line TSL and the dummy word line DWL may be referred to as special word lines, and memory cells associated with these special word lines may be referred to as special memory cells.

As shown in FIG. 2B, in some implementations, the cell array 14$m$ may include top selection cells Cts(1) to Cts(P), dummy memory cells Cd(1) to Cd(P), main memory cells Cm(1,1) to Cm(P,N), bottom selection cells Cbs(1) to Cbs(P) arranged into cell strings S(1) to S(P).

Figure 2C:
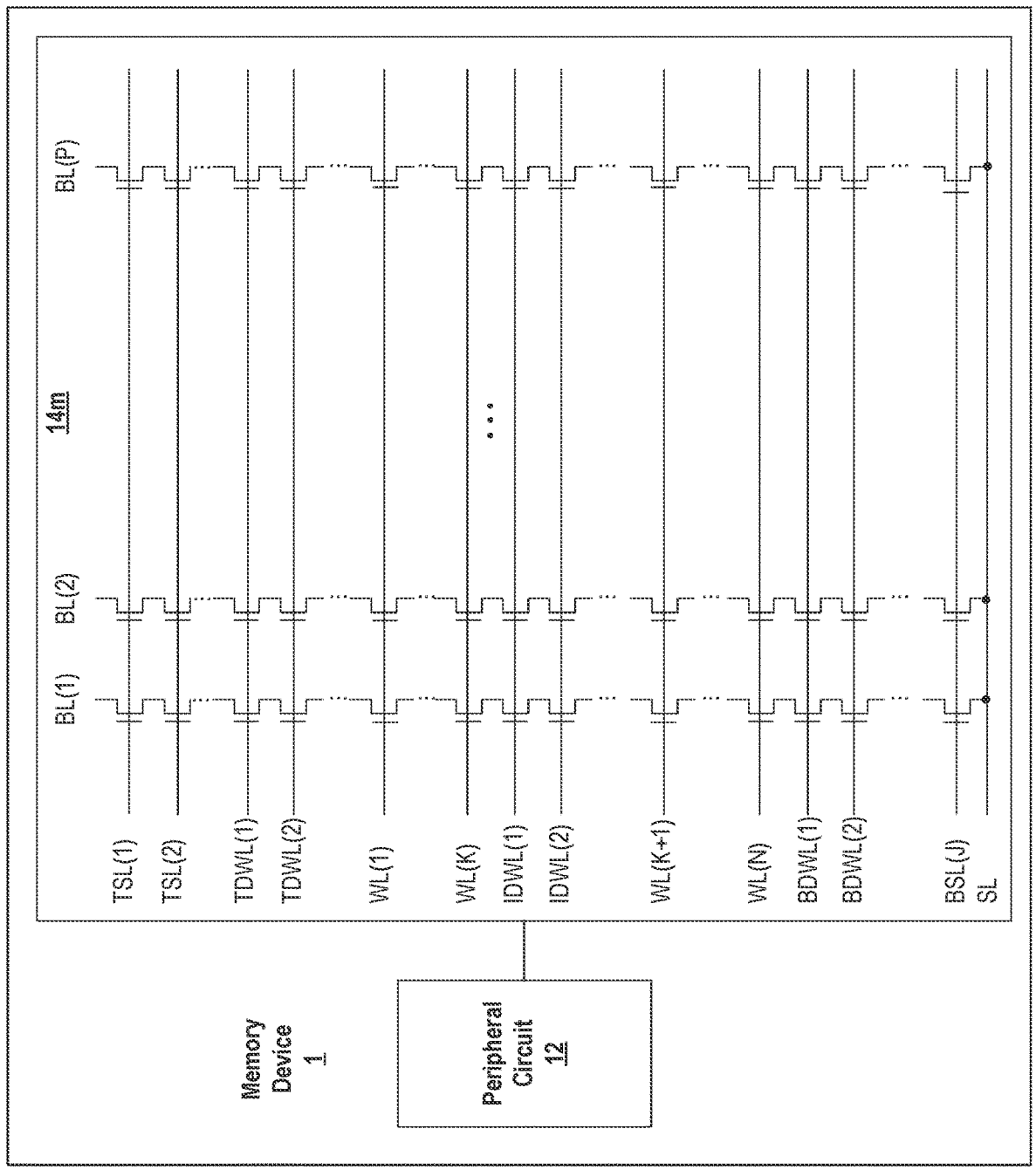
FIG. 2C illustrates a block diagram of still another exemplary memory device, according to some implementations of the present disclosure.

FIG. 2C illustrates a block diagram of still another exemplary memory device, according to some implementations of the present disclosure. Although the memory device may include a plurality of cell arrays 141 to 14M, similar to FIG. 2B, FIG. 2C merely shows the cell array 14$m$ among the plurality of cell arrays, while the others are omitted. In some implementations, the cell array 14$m$ may include a plurality of rows of top selection cells, a plurality of rows of dummy memory cells, and a plurality of rows of bottom selection cells. As shown in FIG. 2C, for example, the cell array 14$m$ may include a plurality of rows of top dummy memory cells, each row being coupled by a top dummy word line, e.g., TDWL(1) or TDWL(2). The plurality of rows of top dummy memory cells may be arranged between the rows of top selection cells (each row being coupled by, e.g., TSL(1) or TSL(2)) and the main memory cells (each row being coupled by WL(1) . . . WL(K)). In some implementations, the cell array 14$m$ may further include a plurality of rows of intermediate dummy memory cells, each row being coupled by an intermediate dummy word line, e.g., IDWL(1) or IDWL(2). In some examples, the intermediate dummy memory cells may include inter-deck plug (IDP) dummy memory cells that may be arranged between main memory cells in a first memory deck (each row being coupled by WL(1) . . . WL(K), respectively) and main memory cells in a second memory deck (each row being coupled by WL(K+1) . . . WL(N), respectively). In some implementations, the cell array 14$m$ may further include a plurality of rows of bottom dummy memory cells, each row being coupled by a bottom dummy word line, e.g., BDWL(1) or BDWL(2). The bottom dummy memory cells may be arranged between the main memory cells (each row being coupled by WL(K+1) . . . WL(N)) and the rows of bottom selection cells (coupled by, e.g., BSL(J)).

In accordance with the scope of the present disclosure, the peripheral circuit 12 of the memory device 1 may be configured to verify and reset the special memory cells (may include the top selection cells Cts(1) to Cts(P) and the dummy memory cells Cd(1) to Cd(P) of the cell arrays 141 to 14M, as shown in, e.g., FIG. 2B), e.g., during an erasing operation, thereby reducing program disturbance.

Returning back to FIG. 2B, each of the top selection cells Cts(1) to Cts(P), the dummy memory cells Cd(1) to Cd(P), the main memory cells Cm(1,1) to Cm(P,N), and the bottom selection cells Cbs(1) to Cbs(P) may be a floating-gate transistor or a charge-trapping transistor including a control terminal, a first terminal, and a second terminal. The top selection line TSL may be coupled to the control terminals of the top selection cells Cts(1) to Cts(P), and the bit lines BL(1) to BL(P) may be respectively coupled to the first terminals of the top selection cells Cts(1) to Cts(P). The dummy word line DWL may be coupled to the control terminals of the dummy memory cells Cd(1) to Cd(P), and the first terminals of the dummy memory cells Cd(1) to Cd(P) may be respectively coupled to the second terminals of the top selection cells Cts(1) to Cts(P). The word lines WL(1) to WL(N) may be coupled to the main memory cells Cm(1,1) to Cm(P,1) in a first row to the main memory cells Cm(1,N) to Cm(P,N) in an Nth row, respectively, and the first terminals of the main memory cells Cm(1,1) to Cm(P,1) may be coupled to the second terminals of the dummy memory cells Cd(1) to Cd(P), respectively. The bottom selection line BSL may be coupled to the control terminals of the bottom selection cells Cbs(1) to Cbs(P), the first terminals of the bottom selection cells Cbs(1) to Cbs(P) may be respectively coupled to the second terminals of the main memory cells Cm(1,N) to Cm(P,N), and the source line SL may be coupled to the second terminals of the bottom selection cells Cbs(1) to Cbs(P). The peripheral circuit 12 may locate and address the main memory cells Cm(1,1) to Cm(P,N) using the word lines WL(1) to WL(N) and the bit lines BL(1) to BL(P).

As described above, the top selection cells Cts(1) to Cts(P) and the dummy memory cells Cd(1) to Cd(P) may be referred to as special memory cells. Each string S(p) may a top selection cell Cts(p), a dummy memory cell Cd(p), main memory cells Cm(p,1) to Cm(p,N), and a bottom selection cell Cbs(p), p being a positive integer and p≤P. The special memory cells Cts(p), Cd(p) may not be configured to store user data, may be arranged at one end of the string S(p), and may be coupled in series. The main memory cells Cm(p,1) to Cm(p,N) may be configured to store user data and coupled in series. The top selection cells Cts(1) to Cts(P), the dummy memory cells Cd(1) to Cd(P), the main memory cells Cm(1,1) to Cm(P,N) and the bottom selection cells Cbs(1) to Cbs(P) may be of a single-level cell (SLC) type, a multi-level cell (MLC) type, a triple-level cell (TLC) type, a quad-level cell (QLC) type, or a higher-level type, and programmed into one of Q possible states, Q being a positive integer greater than 1, e.g., Q=2 for an SLC, Q=4 for an MLC, Q=8 for a TLC, and Q=16 for a QLC.

In a programming operation, the supply voltage (e.g., 3.3V) may be applied to the top selection line TSL, the ground voltage (e.g., 0V) may be applied to the bottom selection line BSL, a program voltage (e.g., 20V) may be applied to a selected word line, a pass voltage (e.g., 10V) may be applied to unselected word lines and the dummy word line DWL, the ground voltage may be applied to a selected bit line, and the supply voltage may be applied to an unselected bit line. For example, when programming the main memory cell Cm(1,1), the top selection line TSL is driven by 3.3V, the bottom selection line BSL is grounded at 0V, the word line WL(1) is driven by 20V, the word lines WL(2) to WL(M) and the dummy word line DWL are driven by 10V, the bit line BL(1) is grounded at 0V and the bit lines BL(2) to BL(P) are driven by 3.3V. In such an arrangement, a large voltage difference is present between a channel region and the control terminal of a selected main memory cell, causing electrons to be injected from the channel region into a floating gate or charge-trapping layer of the selected main memory cell to program the same, while boosted voltages (e.g., 8V) are established at channel regions of unselected main memory cells by capacitive coupling the pass voltage from the control terminals to the channel regions thereof, preventing the unselected main memory cells from being programmed and reducing program disturbance.

The top selection cells Cts(1) to Cts(P) may be programmed into a pre-determined state (e.g., an erased state) prior to the programming operation. The dummy memory cells Cd(1) to Cd(P) may be programmed into a pre-determined state (e.g., the erased state) prior to the programming operation, and biased at the control terminals thereof by the pass voltage or a dummy bias voltage during the programming operation, providing a gradual transition in channel voltages from the channel voltages of channel regions of the main memory cells Cm(1,1) to Cm(P,1) to the channel voltages of channel regions of the top selection cells Cts(1) to Cts(P), reducing program disturbance by suppressing gate induced drain leakage (GIDL) during the programming operation, particularly during programming one of the main memory cells Cm(1,1) to Cm(P,1). In some implementations, the dummy bias voltage may be selected from a range between the pass voltage and the supply voltage.

In an erasing operation, in addition to erasing user data from the main memory cells Cm(1,N) to Cm(P,N), the threshold voltages of the special memory cells (e.g., the top selection cells Cts(1) to Cts(P) and the dummy memory cells Cd(1) to Cd(P), as shown in FIG. 2B) may be verified and reset if the verification fails, thereby enabling the special memory cells to operate properly and reduce the program disturbance in the programming operation. In some implementations, the reset of the special memory cells may be optional, and the setting of reset preference may be stored in a register in the memory device 1. When the reset preference is set to be enabled, the peripheral circuit 12 may reset the special memory cells (e.g., the top selection cells Cts(1) to Cts(P) and the dummy memory cells Cd(1) to Cd(P), as shown in FIG. 2B) upon detecting that the special memory cells fail the verification; whereas when the reset preference is not set to be enabled, the peripheral circuit 12 may abort the erasing operation upon detecting that the special memory cells (.e.g., the top selection cells Cts(1) to Cts(P) and the dummy memory cells Cd(1) to Cd(P), as shown FIG. 2B) fail the verification.

For the simplicity of description, the above description employs FIG. 2B to be an illustrative example to describe the features in regard to the special memory cells. It can be understood that in accordance with the scope of the present disclosure, the special memory cells in FIG. 2C (including the plurality of rows of top selection cells, and the plurality of rows of top, intermediate, and bottom dummy memory cells) may also possess the features described above.

FIGS. 3 to 6 outline erasing methods and resetting methods of resetting the special memory cells (e.g., the top selection cells Cts(1) to Cts(P) and the dummy memory cells Cd(1) to Cd(P), as shown in FIG. 2B) in the erasing operation. In the following description, some implementations of the present disclosure will be described with reference to FIGS. 3 to 6. For ease of description, FIG. 2B is used to make the following description in regard to the features of the special memory cells. It should be emphasized that the special memory cells in FIG. 2C may also possess these features.

Figure 3A:
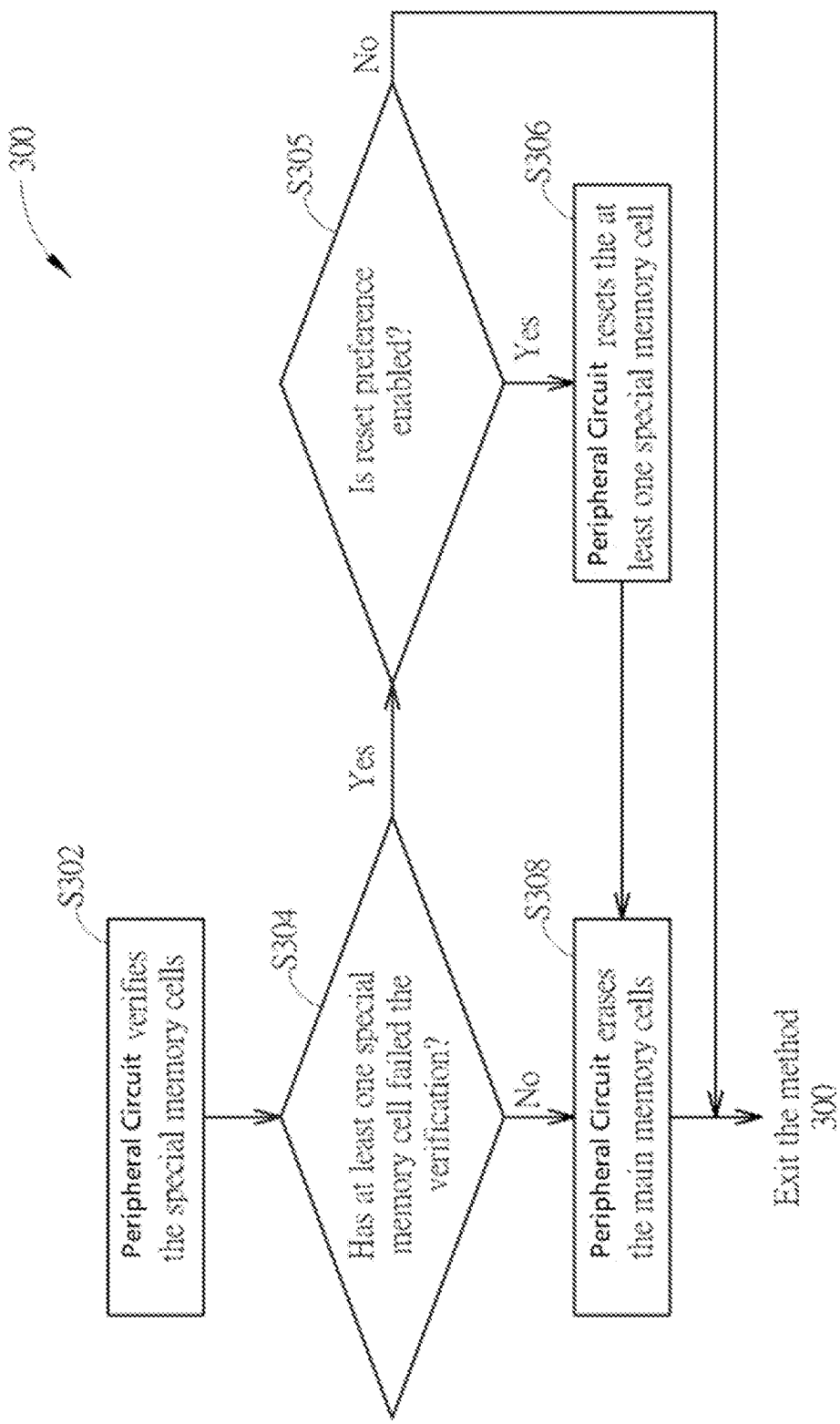
FIG. 3A illustrates a flowchart showing an exemplary erasing method, including an optional reset operation, implemented to a memory device, according to some implementations of the present disclosure.

FIG. 3A illustrates a flowchart of an exemplary erasing method 300, including an optional reset operation, implemented to a memory device (e.g., the memory device 1 in FIG. 1), according to some implementations of the present disclosure. The erasing method 300 may include S302 to S308, resetting the special memory cells prior to erasing data from the main memory cells (e.g., Cm(1,N) to Cm(P,N) in FIG. 2B). S302 to S306 may be configured to set the special memory cells to proper threshold voltage ranges, and S308 may be configured to erase the main memory cells. In some implementations, using FIG. 2B as an example, the erasing method may be adopted by the memory device 1 to verify and reset the top selection cells, for example, Cts(1) to Cts(P) in FIG. 2B. Any reasonable step change or adjustment may still be within the scope of the present disclosure. Method 300 in FIG. 3A is explained as follows:

At S302: The peripheral circuit 12 may verify the special memory cells.

In some examples, the term "special memory cells" may be used to refer to the top selection cells Cts(1) to Cts(P) and the dummy memory cells Cd(1) to Cd(P) as shown in FIG. 2B, while in FIG. 2C, the special memory cells may be referred to as the plurality of rows of top selection cells and the plurality of rows of top, intermediate, and bottom dummy memory cells coupled by the dummy word lines. The present disclosure does not limit thereto.

At S304: The peripheral circuit 12 may determine whether at least one special memory cell has failed the verification. If so, the method may go to S305; and if not, it may go to S308.

At S305: It may be determined whether a reset preference is enabled. If so, it may go to S306; and if not, it may exit the method 300.

In some implementations, the reset preference may be pre-determined, and the setting preference may be stored in the system for later retrieval. When the reset preference is set to be enabled, the peripheral circuit 12 may reset the special memory cells (e.g., the top selection cells Cts(1) to Cts(P) and the dummy memory cells Cd(1) to Cd(P), as shown in FIG. 2B) upon detecting that the special memory cells failed the verification; whereas when the reset preference is not set to be enabled, the peripheral circuit 12 may abort the erasing operation upon detecting that the special memory cells fail the verification.

At S306: The peripheral circuit 12 may reset the at least one special memory cell. Further, the method may proceed to S308.

At S308: The peripheral circuit 12 may erase the main memory cells, and it may exit the method 300.

Upon initialization of the erasing method 300, the peripheral circuit 12 may verify the special memory cells, e.g., using an upper verification level and a lower verification level (or termed "verification bounds") (S302). In some implementations, the upper verification level and the lower verification level may be selected according to the lower bound and the upper bound of a pre-determined threshold voltage distribution range of the special memory cells, respectively. That is, the verification bounds may be preset. When the threshold voltage of at least one special memory cell is outside the pre-determined threshold voltage distribution range, the at least one special memory cell may not function properly and may lead to program disturbance, and it may be determined that the at least one special memory cell has failed the verification.

Further, the peripheral circuit 12 may determine whether at least one special memory cell has failed the verification (S304), if not, the peripheral circuit 12 may erase the main memory cells (e.g., Cm(1,1) to Cm(P,N) as shown in FIG. 2B) (S308) and exit the method 300, and if so, the peripheral circuit 12 may determine whether the reset preference is set to be enabled (S305). If the at least one special memory cell has failed the verification and the reset preference is not set to be enabled, the method 300 is exited without erasing the memory cells (e.g., Cm(1,1) to Cm(P,N) as shown in FIG. 2B). If at least one special memory cell has failed the verification and the reset preference is set to be enabled, the peripheral circuit 12 may reset the at least one special memory cell by bringing the threshold voltage of the at least one special memory cell back within the pre-determined threshold voltage distribution range (S306), and may further erase the main memory cells (e.g., Cm(1,1) to Cm(P,N) as shown in FIG. 2B) (S308).

Under the enabled reset preference, in some implementations, upon determining that at least one special memory cell failed, one or more flag signals may be generated. In response to the one or more flag signals, the reset operation on the at least one special memory cell may be performed. The details of the reset operation will be described in the following.

As described above, FIG. 3A illustrates the method 300 in which the reset operation (at S306) is performed prior to the erasing operation (at S308). It can be understood that this operation sequence is optional. In some implementations, the erasing operation may be performed before the reset operation, as shown in FIG. 3B.

Figure 3B:
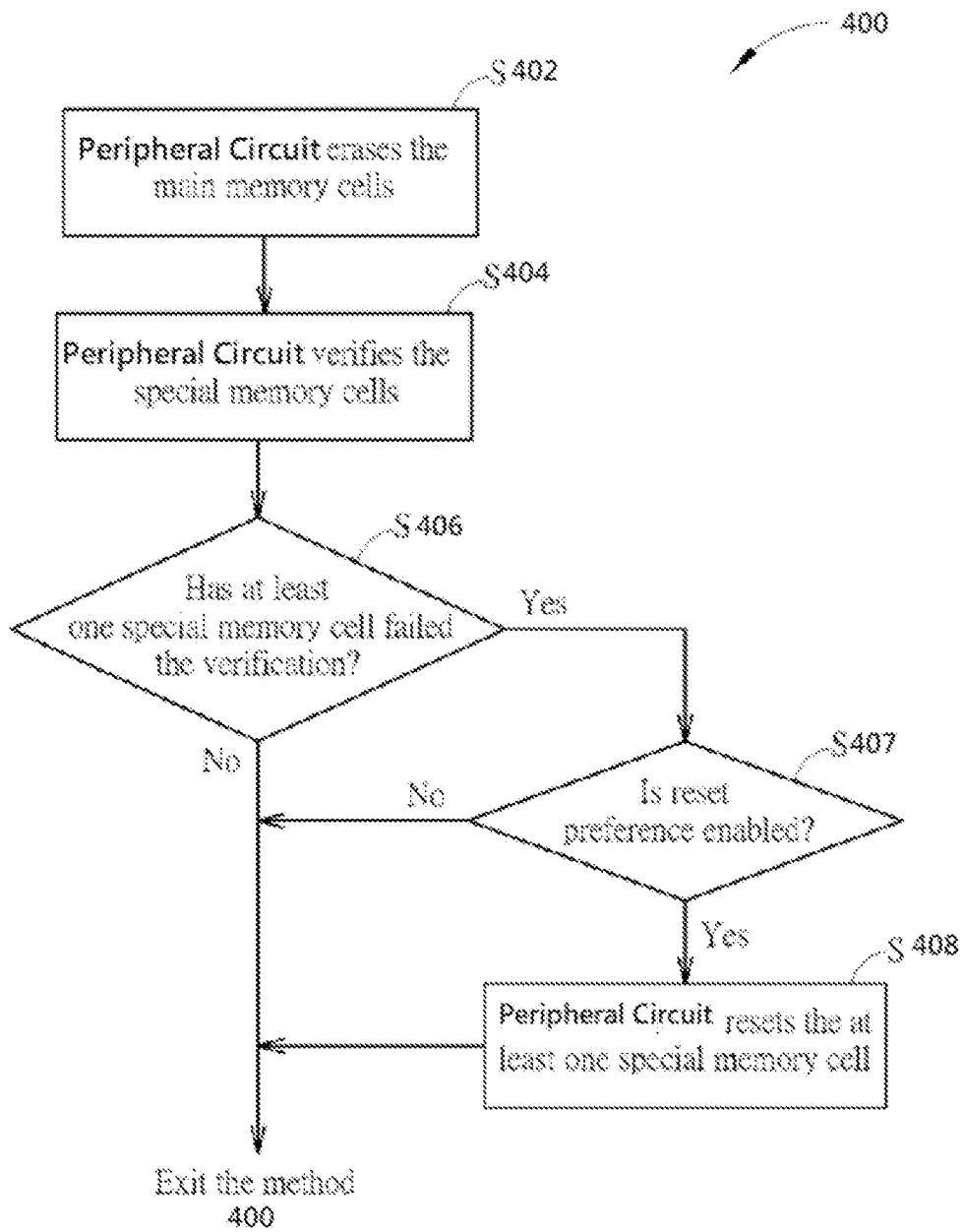
FIG. 3B illustrates a flowchart showing another exemplary erasing method, including an optional reset operation, implemented to a memory device, according to some implementations of the present disclosure.

FIG. 3B illustrates a flowchart of another erasing method 400, including an optional reset operation, implemented to a memory device (e.g., the memory device 1 in FIG. 1), according to some implementations of the present disclosure. The erasing method 400 may include S402 to S408, erasing data from the main memory cells (e.g., Cm(1,N) to Cm(P,N) as shown in FIG. 2B) prior to resetting the special memory cells. S402 may be configured to erase the main memory cells, and S404 to S408 may be configured to set the special memory cells to proper states. In some implementations, the erasing method may be adopted by the memory device to verify and reset the dummy memory cells (e.g., Cd(1) to Cd(P) as shown in FIG. 2B). Any reasonable step change or adjustment may be still within the scope of the present disclosure. The method 400 in FIG. 3B is explained as follows:

At S402: The peripheral circuit 12 may erase the main memory cells. Compared to FIG. 3A, in the current method 400, the erasing operation can be performed before the verification operation and the optional reset operation.

At S404: The peripheral circuit 12 may verify the special memory cells.

In some examples, the term "special memory cells" may be used to refer to the top selection cells Cts(1) to Cts(P) and the dummy memory cells Cd(1) to Cd(P) as shown in FIG. 2B, while in FIG. 2C, the special memory cells may be used to refer to the plurality of rows of top selection cells and the plurality of rows of top, intermediate, and bottom dummy memory cells coupled by the dummy word lines. The present disclosure does not limit thereto.

At S406: The peripheral circuit 12 may determine whether at least one special memory cell has failed the verification. If so, the method may go to S407; and if not, it may exit the method 400.

At S407: It may be determined whether a reset preference is enabled. If so, the method may go to S408; and if not, it may exit the method 400.

In some implementations, the reset preference may be pre-determined, and the setting may be stored in the system for later retrieval. When the reset preference is set to be enabled, the peripheral circuit 12 may reset the special memory cells (e.g., the top selection cells Cts(1) to Cts(P) and the dummy memory cells Cd(1) to Cd(P), as shown in FIG. 2B) upon detecting that the special memory cells failed the verification; whereas when the reset preference is not set to be enabled, the peripheral circuit 12 may abort the erasing operation upon detecting that the special memory cells fail the verification.

At S408: The peripheral circuit 12 may reset the at least one special memory cell. It may further exit the method 400.

Upon initialization of the erasing method 400, the peripheral circuit 12 may erase the main memory cells (e.g., Cm(1,N) to Cm(P,N) as shown in FIG. 2B) (S402) and may further verify the special memory cells, e.g., using an upper verification level and a lower verification level (S504). The upper verification level and the lower verification level may be selected according to the lower bound and the upper bound of a pre-determined threshold voltage distribution range of the special memory cells, respectively. When the threshold voltage of at least one special memory cell is outside the pre-determined threshold voltage distribution range, the at least one special memory cell may not function properly and may lead to program disturbance, and the at least one special memory cell has failed the verification. The peripheral circuit 12 may determine whether at least one special memory cell has failed the verification (S406); if not, the peripheral circuit 12 may exit the method 400, and if so, the peripheral circuit 12 may determine whether the reset preference is set to be enabled (S407).

If at least one special memory cell has failed the verification and the reset preference is not set to be enabled, the method 400 is exited directly without resetting the at least one special memory cell. If the at least one special memory cell has failed the verification and the reset preference is set to be enabled, the peripheral circuit 12 may reset the at least one special memory cell by bringing the threshold voltage of the at least one special memory cell back within the pre-determined threshold voltage distribution range (S408) and then exit the method 400.

Figure 4A:
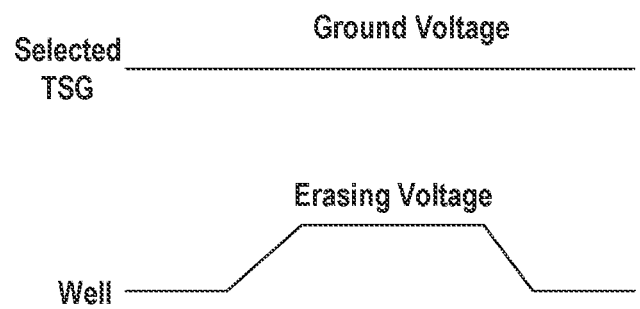
FIG. 4A illustrates a schematic diagram showing an exemplary erasing operation in resetting one selected special memory cell, according to some implementations of the present disclosure.
Figure 4B:
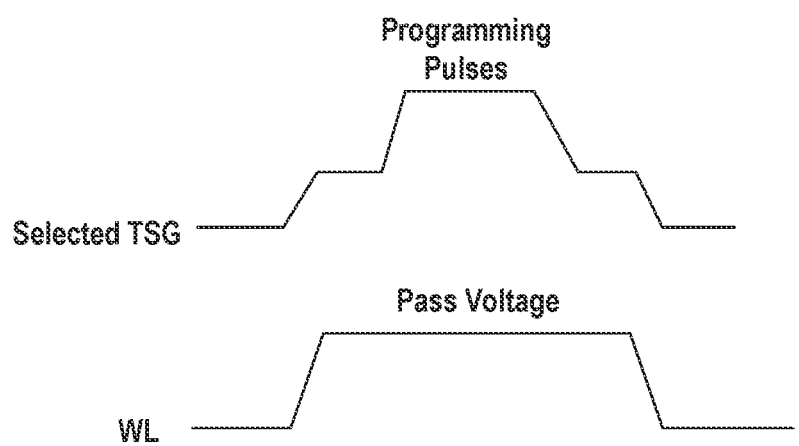
FIG. 4B illustrates a schematic diagram showing an exemplary programming operation in resetting one selected special memory cell, according to some implementations of the present disclosure.

In the present disclosure, the term "resetting the at least one special memory cell" may be used to refer to performing an erasing operation on the at least one special memory cell and performing a subsequent programming operation on the at least one special memory cell. FIG. 4A illustrates a schematic diagram showing an exemplary erasing operation in resetting one selected special memory cell, while FIG. 4B illustrates another schematic diagram showing an exemplary subsequent programming operation in resetting the selected special memory cell, according to some implementations of the present disclosure. It can be understood that the voltage schemes, according to FIGS. 4A and 4B, can be applied to the reset operation in FIG. 3A, 3B, or another resetting scenario.

Under the enabled reset preference, in some implementations, in response to detecting that at least one special memory cell failed (i.e., a detected special memory cell or a selected special memory cell), a flag signal (e.g., a reset enable signal) may be generated, e.g., through the peripheral circuit 12, to trigger a subsequent reset operation. In response to the reset enable signal, the peripheral circuit 12 may reset the selected special memory cell (e.g., corresponding to S306 in FIG. 3A or S408 in FIG. 3B). In some examples, the reset operation on the at least one special memory cell may include an erasing operation on the at least one special memory cell as shown in FIG. 4A and a subsequent programming operation on the at least one special memory cell as shown in FIG. 4B.

In some implementations, for performing the erasing operation in the reset operation, the ground voltage (e.g., 0V) may be applied to the control terminal of the at least one special memory cell. For example, the at least one special memory cell may include a top selection gate TSG, e.g., the selected TSG in FIG. 4A. The ground voltage may be applied to a control terminal of the top selection gate TSG, and one or more voltages as applied to other special word lines may depend on the practical applications. For example, an erasing voltage may be applied to a well (e.g., a high voltage P-well, HVPW) corresponding to the selected TSG, as shown in FIG. 4A. In some examples, the top selection gate TSG and the main memory cells may be erased simultaneously. In other examples, all of the special memory cells and the main memory cells may be erased simultaneously. In some implementations, at least a part of the aforementioned voltages may be generated by voltage generator 210 of the peripheral circuit 12.

Subsequently, the programming operation on the at least one special memory cell may be performed. For example, the at least one special memory cell that has failed in the verification process may include a top selection gate TSG, e.g., the selected TSG in FIG. 4B. One or more programming pulses may be sequentially (e.g., consecutively) applied to the control terminal of the selected TSG, as shown in FIG. 4B, such that the threshold voltage of the top selection gate TSG can reach the desired voltage level. Meanwhile, a pass voltage may be applied to each main word line while programming the top selection gate TSG. Accordingly, the resetting process on the at least one special memory can be completed.

In the present disclosure, the term "pass voltage" may be used to describe a voltage configured to turn on a memory cell. Meanwhile, in some technology, the terms "top selection gate" and "top selection cell" may be used interchangeably, and the terms "bottom selection gate" and "bottom selection cell" may be used interchangeably.

Figure 5A:
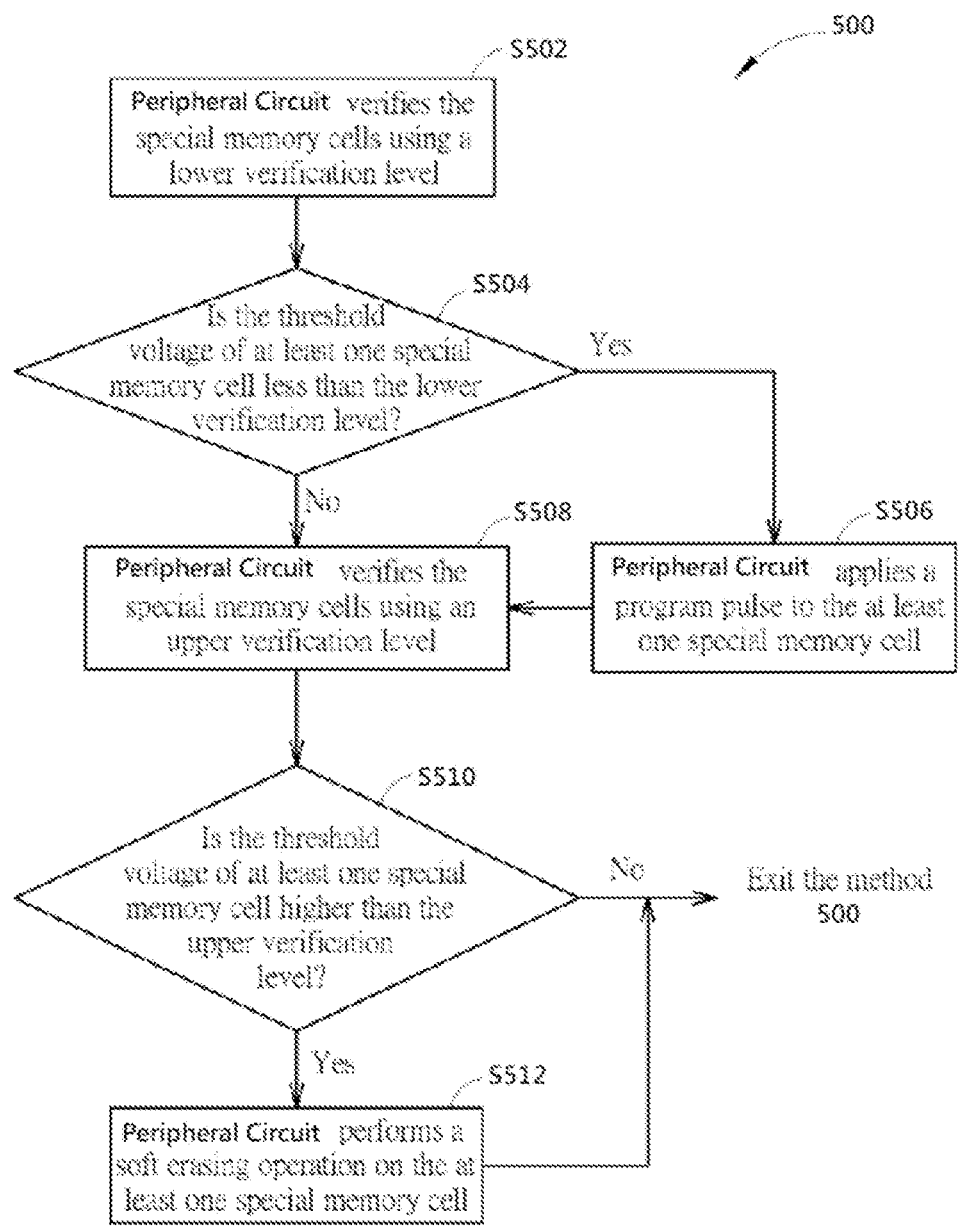
FIG. 5A illustrates a flowchart showing an exemplary resetting method contained in an erasing method, according to some implementations of the present disclosure.

FIG. 5A illustrates a flowchart of an exemplary resetting method 500 contained in an erasing method, according to some implementations of the present disclosure. The method 500 may have less impact on the erasing time ($t_{ERs}$). Therefore, the method 500 may be applied to the reset operation prior to an erasing operation on the main memory cells, e.g., corresponding to S306 in the method 300 of FIG. 3A.

The resetting method 500 may include S502 to S512 for verifying and resetting the special memory cells. Any reasonable step change or adjustment may still be within the scope of the present disclosure. The method 500 in FIG. 5A is explained as follows:

At S502: The peripheral circuit 12 may verify the special memory cells using a lower verification level.

In some examples, the term "special memory cells" may be used to refer to the top selection cells Cts(1) to Cts(P) and the dummy memory cells Cd(1) to Cd(P) as shown in FIG. 2B, while in FIG. 2C, the special memory cells may be referred to as the plurality of rows of top selection cells and the plurality of rows of top, intermediate, and bottom dummy memory cells coupled by the dummy word lines. The present disclosure does not limit thereto.

At S504: It may be determined whether the threshold voltage of at least one special memory cell is lower than the lower verification level. If so, the method may go to S506; and if not, it may go to S508.

At S506: The peripheral circuit 12 may apply one or more program pulses to the at least one special memory cell. It may further go to S508.

In some implementations, one program pulse may be applied to the at least one special memory cell. The peripheral circuit 12 may further verify whether the threshold voltage of the at least one special memory cell is still lower than the lower verification. If so, another or more program pulses may be applied to the at least one special memory cell again, until the threshold voltage of the at least one special memory cell is above the lower verification level.

At S508: The peripheral circuit 12 may verify the special memory cells using an upper verification level.

At S510: It may be determined whether the threshold voltage of at least one special memory cell is higher than the upper verification level. If so, the method may go to S512; and if not, it may exit the method 500.

At S512: The peripheral circuit 12 may perform a soft erasing operation on the at least one special memory cell. It may further exit the method 500.

At S502, the peripheral circuit 12 may apply the lower verification level to the control terminals of the special memory cells while reading the states thereof, and at S504, the peripheral circuit 12 may determine whether the threshold voltage of at least one special memory cell is lower than the lower verification level according to the reading result. If a state of at least one special memory cell is read correctly using the lower verification level, the threshold voltage of the at least one special memory cell is lower than the lower verification level and is too low. And therefore, at S506, the peripheral circuit 12 may apply one or more program pulses to the at least one special memory cell until the peripheral circuit 12 is unable to read the state of the at least one special memory cell.

Next, at S508, the peripheral circuit 12 may apply the upper verification level to the control terminals of the special memory cells while reading the states thereof, and at S510, the peripheral circuit 12 may determine whether the threshold voltage of at least one special memory cell is higher than the upper verification level according to the reading result. If a state of at least one special memory cell is read incorrectly using the upper verification level, the threshold voltage of the at least one special memory cell is not higher than the upper verification level, and the method 400 is exited. If a state of at least one special memory cell is read correctly using the upper verification level, the threshold voltage of the at least one special memory cell is higher than the upper verification level and is too high. And therefore, at S512, the peripheral circuit 12 may perform a soft erasing operation on the at least one special memory cell to bring the threshold voltage thereof to below the upper verification level and exits the method 500.

Figure 5B:
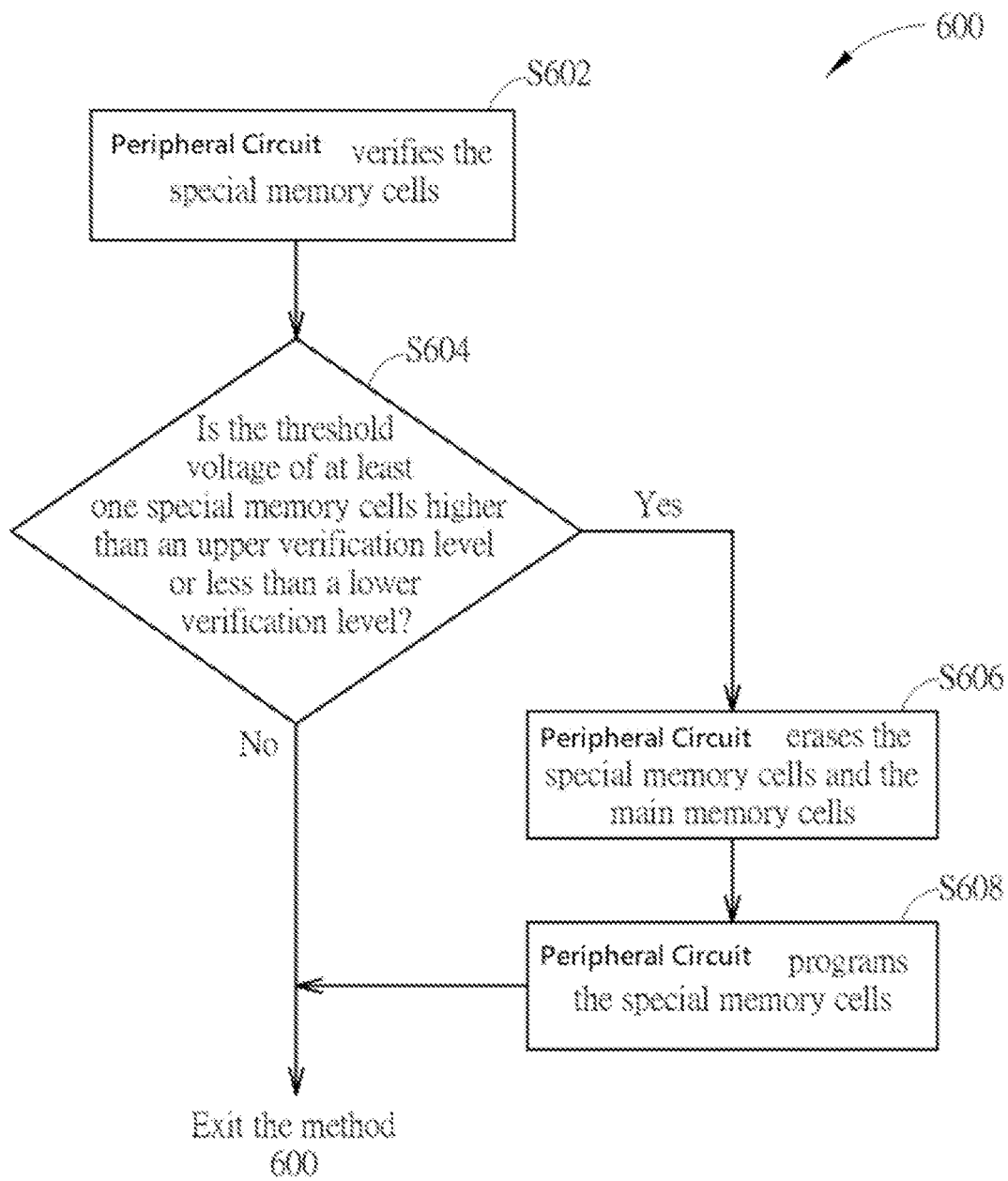
FIG. 5B illustrates a flowchart showing another exemplary resetting method, according to some implementations of the present disclosure.

In some implementations, the soft erasing operation may be performed by grounding the control terminal of the at least one special memory cell while applying an appropriate soft erasing voltage to the bit line of the at least one special memory cell, thereby discharging excessive charges from the floating gate or charge-trapping layer of the at least one special memory cell. The soft erasing voltage may be a positive voltage and smaller in magnitude than an erasing voltage adopted in an erasing operation. In some implementations, the order of verifying and correcting the special memory cells being too low in threshold voltages and the special memory cells being too high in threshold voltages may be exchanged; that is, S508 to S512 and S502 to S506 may be swapped in places. FIG. 5B illustrates a flowchart showing another exemplary resetting method 600, according to some implementations of the present disclosure. In some implementations, the method 600 may be suited to be applied to the threshold voltage verification after an erasing operation, e.g., in the method 400 as shown in FIG. 3B; however, to which the present disclosure does not limit.

The method 600 may include S602 to S608 for resetting the special memory cells. Any reasonable step change or adjustment may still be within the scope of the present disclosure. The method 600 in FIG. 5B is explained as follows:

At S602: The peripheral circuit 12 may verify the special memory cells.

In some examples, the term "special memory cells" may be referred to as the top selection cells Cts(1) to Cts(P) and the dummy memory cells Cd(1) to Cd(P) as shown in FIG. 2B, while in FIG. 2C, the special memory cells may be referred to as the plurality of rows of top selection cells and the plurality of rows of top, intermediate, and bottom dummy memory cells coupled by the dummy word lines. The present disclosure does not limit thereto.

At S604: It may be determined whether the threshold voltage of at least one special memory cell is higher than an upper verification level or lower than a lower verification level. If any of these conditions meets, the method may go to S606; and if not, it may exit the method 600.

At S606: The peripheral circuit 12 may erase the special memory cells and the main memory cells.

At S608: The peripheral circuit 12 may program the special memory cells; it may further exit the method 600.

At S602, the peripheral circuit 12 may apply the lower verification level or the upper verification level to the control terminals of the special memory cells to read the states thereof, and at S604, the peripheral circuit 12 may determine whether the threshold voltage of at least one special memory cell is higher than the upper verification level or lower than the lower verification level according to the reading result. If a state of at least one special memory cell is read correctly using the lower verification level, the threshold voltage of the at least one special memory cell is lower than the lower verification level and is too low. Further, if a state of at least one special memory cell is read correctly using the upper verification level, the threshold voltage of the at least one special memory cell is higher than the upper verification level and is too high.

If the threshold voltage of at least one special memory cell is higher than the upper verification level or lower than the lower verification level, the peripheral circuit 12 may erase the special memory cells and the main memory cells (e.g., Cm(1,1) to Cm(P,N) as shown in FIG. 2B) simultaneously (S606) and may program the special memory cells to the corresponding pre-determined states (S608) and exit the method 600. The erasing of the special memory cells and the main memory cells (e.g., Cm(1,1) to Cm(P,N) as shown in FIG. 2B) may be performed by grounding the control terminals of the special memory cells and the main memory cells (e.g., Cm(1,1) to Cm(P,N) as shown in FIG. 2B) while applying an appropriate erasing voltage to the bit lines of the special memory cells and the main memory cells (e.g., Cm(1,1) to Cm(P,N) as shown in FIG. 2B), thereby discharging all charges from the floating gate or charge-trapping layer of the special memory cells and the main memory cells (e.g., Cm(1,1) to Cm(P,N) as shown in FIG. 2B).

Figure 6:
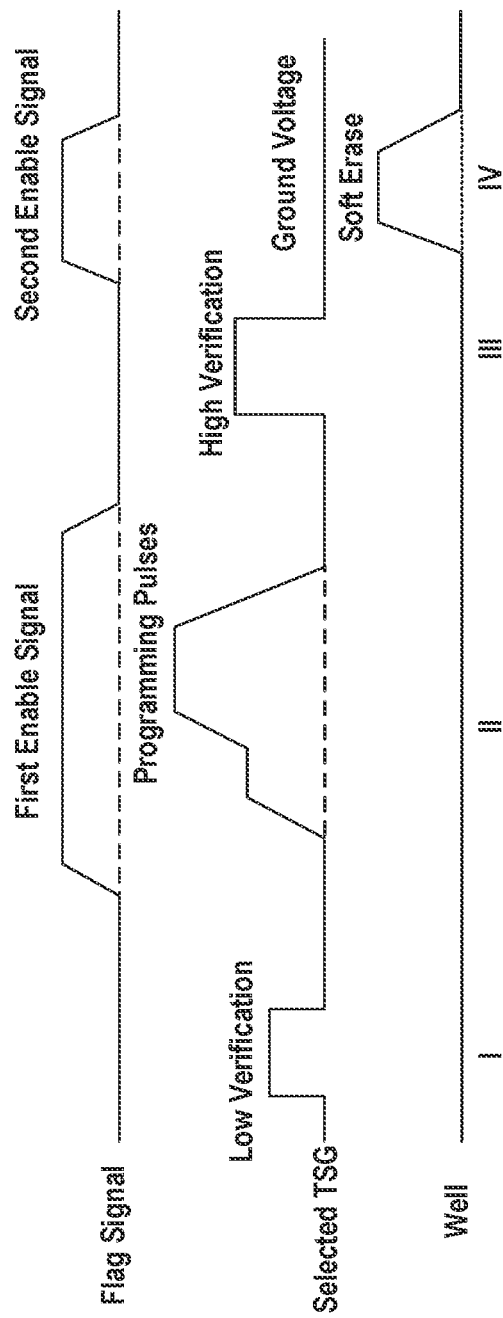
FIG. 6 illustrates a schematic diagram showing an exemplary reset operation on one selected special memory cell based on FIG. 5A, according to some implementations of the present disclosure.

FIG. 6 illustrates a schematic diagram showing an exemplary reset operation on one selected special memory cell based on FIG. 5A, according to some implementations of the present disclosure. According to FIG. 5A, at S504 by applying a first verification voltage to a control terminal of the selected special memory cell, the threshold voltage of the special memory cell may be verified to determine whether the threshold voltage is lower than the lower verification level. This process may correspond to the "low verification" at zone I in FIG. 6. If the threshold voltage is lower than the lower verification level, a flag signal (e.g., a first enable signal in FIG. 6) may be generated. In response to the first enable signal, the peripheral circuit 12 may apply one or more programming pulses sequentially, at zone II in FIG. 6, to a control terminal of the at least one special memory cell to pull up the threshold voltage of the at least one special memory cell.

In the example shown in FIG. 6, the at least one special memory cell that failed the verification based on the lower verification level may include a selected top selection cell TSG. The one or more programming pulses may be applied to a control terminal of the top selection gate TSG sequentially. Returning to FIG. 5B, at S508 and S510 by applying a second verification voltage (corresponding to zone III in FIG. 6) to the control terminal of the selected top selection gate TSG, the threshold voltage of the top selection gate TSG may be verified to determine whether the threshold voltage is higher than the upper verification level. This process may correspond to the "high verification" at zone III in FIG. 6. The second verification voltage may be higher than the first verification voltage. If the threshold voltage is higher than the upper verification level, another flag signal (e.g., a second enable signal in FIG. 6) may be generated. In response to the second enable signal, the peripheral circuit 12 may perform a soft erasing operation on the at least one special memory cell, e.g., the selected TSG in FIG. 6. In some implementations, the ground voltage may be applied to the control terminal of the top selection gate TSG that has failed, thereby pulling down the threshold voltage of the selected top selection gate TSG. Consequently, the threshold voltage of the at least one special memory cell can be arranged to be below the upper verification level. In some implementations, the soft erasing operation may be performed by grounding the control terminal of the top selection gate TSG, while applying a soft erasing voltage to a well (e.g., a high voltage P-well, HVPW) corresponding to the selected TSG, thereby discharging excessive charges from the top selection gate TSG. The soft erasing voltage may be a positive voltage. In some examples, the first enable signal may be different from the second enable signal to distinguish the first enable signal from the second enable signal.

In some examples, the threshold voltage of the at least one special memory cell may be within the lower verification level and the higher verification level, and the verification processes may be recognized as successful. For those scenarios, the first enable signal and the second enable signal may not be triggered, and thus the threshold voltage of the detected special memory cell may not be changed. The process may be illustrated in the dotted lines of FIG. 6.

It can be understood that FIG. 6 is provided as an illustrative example for the description. In some verification operations, for example, only one of the low verification and the high verification may indeed fail the verification operations. Meanwhile, although a voltage scheme is not provided for FIG. 5B, by applying similar or same technical skills and/or voltage schemes as described above, the special memory cells and the main memory cells can be erased simultaneously, and subsequently, the special memory cells can be programmed to enable the threshold voltages within suitable ranges.

Figure 7:
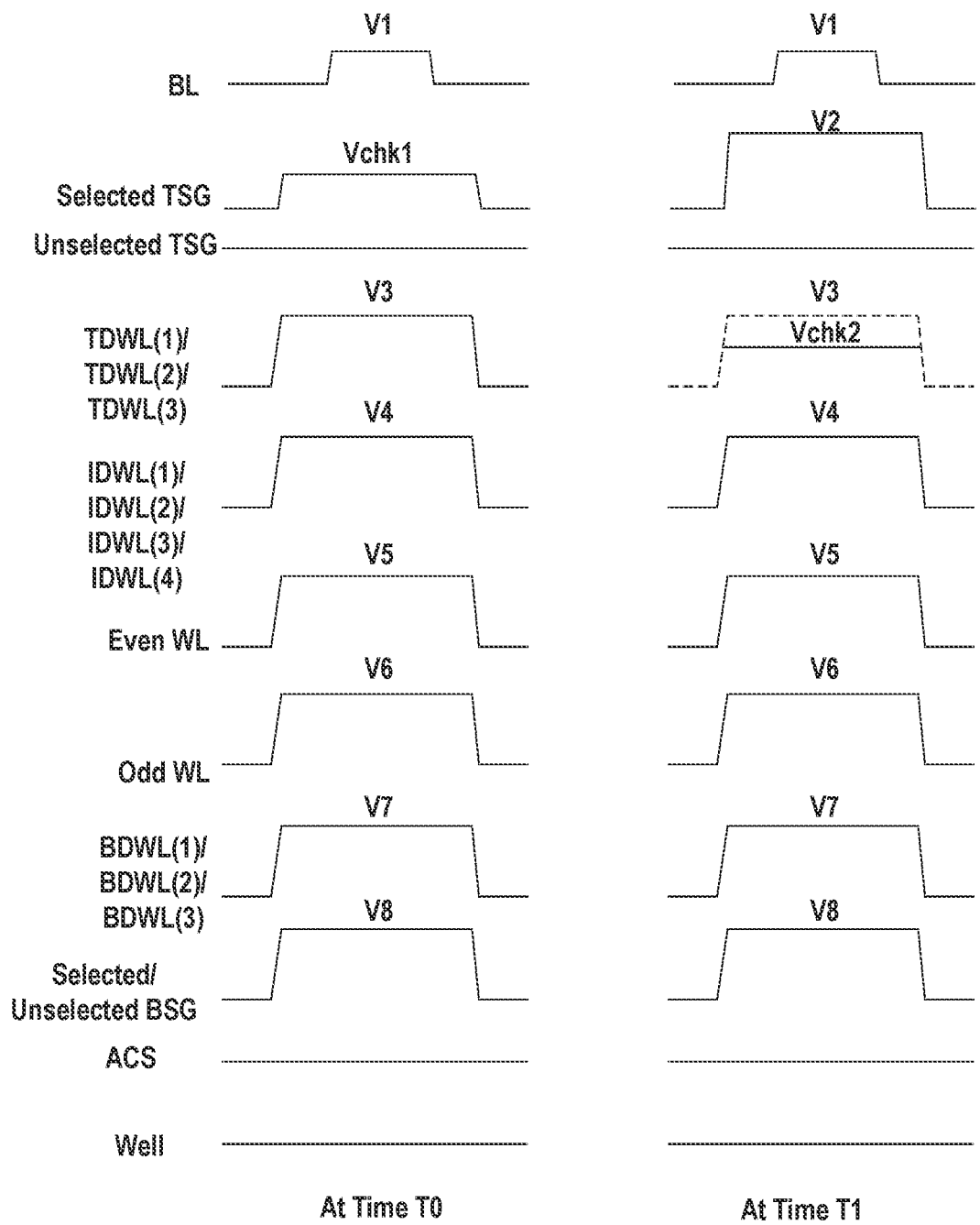
FIG. 7 illustrates a schematic diagram showing an exemplary voltage scheme applied to main memory cells, special memory cells, and other cells in a verification process, according to some implementations of the present disclosure.

FIG. 7 illustrates a schematic diagram showing an exemplary voltage scheme applied to main memory cells, special memory cells, and other cells in a verification process, according to some implementations of the present disclosure. In accordance with the scope of the present disclosure, the voltage waveforms may be performed before an erasing operation (the method 300 in FIG. 3A) or after an erasing operation (the method 400 in FIG. 3B) to verify the threshold voltage of, e.g., the special memory cells. The present disclosure does not place limitations on the application timing.

As shown in FIG. 7, the peripheral circuit 12 may select one or more special memory cells for the threshold voltage verification. It can be understood that the present disclosure does not limit the order of verifying or checking the special memory cells. In some implementations, the special memory cells in the same memory string with the main memory cell that has a higher read error rate may be assigned with a higher probability for the threshold voltage verification. That is, those special memory cells may be verified more frequently than others.

In some implementations, the threshold voltage verification may be performed by applying a verification voltage to a special word line that is coupled to a control terminal of the selected special memory cell, while applying an appropriate bit-line voltage to the bit line corresponding to the selected special memory cell. In some implementations, as described above, the verification voltage may be generated by voltage generator 210 in the peripheral circuit, as shown in FIG. 2A, and transmitted through a corresponding special word line coupled to a control terminal of the selected special memory cell in cell arrays 202. Further, a state of the selected special memory cell may be read out to determine whether the selected special memory cell has failed.

FIG. 7 illustrates an exemplary threshold voltage verification scheme, at time T0, in which one top selection cell (or termed "top selection gate") TSG coupled to a top selection line TSL may be selected for the threshold voltage verification. In some implementations, a verification voltage $V_{chk1}$ may be applied to a control terminal of the top selection cell TSG, while a ground voltage may be applied to an unselected top selection cell corresponding to another bit line. The unselected special memory cells may be used to refer to those special memory cells whose threshold voltages are not being verified at that time instant, i.e., unverified special memory cells. In another example, at time T1, one top dummy memory cell coupled to a top dummy word line may be selected for the threshold voltage verification, and a verification voltage $V_{chk2}$ may be applied to a control terminal of the top dummy memory cell. In some implementations, a ground voltage may be applied to an array common source (ACS) and a well (e.g., a high voltage P-well, HVPW), respectively, if applicable.

In some implementations, the verification voltage $V_{chk1}$ may be lower than a first voltage (e.g., V3 or V4) that is applied to a special word line coupled to an unselected special memory cell and lower than a second voltage (e.g., V5 or V6) that is applied to the main memory cells, in the same bit line. In some implementations, a portion of the first voltage and the second voltage may be different, e.g., V3≠V4. Further, a verification voltage applied to one of the selected special word lines may be different from another verification voltage applied to another one of the selected special word lines. For example, as shown in FIG. 7, verification voltage $V_{chk1}$ applied to the selected top selection line verified at time T0 may be different from verification voltage $V_{chk2}$ applied to a selected top dummy word line verified at time T1, the values of which may depend on the semiconductor properties of the transistors corresponding to the special memory cells. In the example shown in FIG. 7, the voltages applied to the even main word lines (V5) and the odd main word lines (V6) may be different; however, the present disclosure does not limit thereto.

In some implementations, when the cell array 14m includes a plurality of rows of top dummy memory cells, an identical voltage may be applied to the special word lines coupled to the control terminals of the top dummy memory cells in one verification. For example, as shown in FIG. 7, V3 may be applied to each of TDWL(1), TDWL(2), and TDWL (3) while verifying the threshold voltage of the selected TSG. In some implementations, when the cell array 14m includes a plurality of rows of top dummy memory cells, a plurality of rows of intermediate dummy memory cells, and a plurality of rows of bottom dummy memory cells, an identical voltage can be applied to all the special word lines coupled to the control terminals of these special memory cells, i.e., V3=V4=V7.

It can be understood that, in some examples, the first voltage scheme (at time T0) and the second voltage scheme (at time T1) may not be associated with the same timing line and may not be applied sequentially, as shown in FIG. 7. In other words, they may appear in different verification processes. For example, in one verification process on the special memory cells, only the first voltage scheme may be applied, whereas in another verification process on the special memory cells, only the second voltage scheme may be applied.

Figure 8:
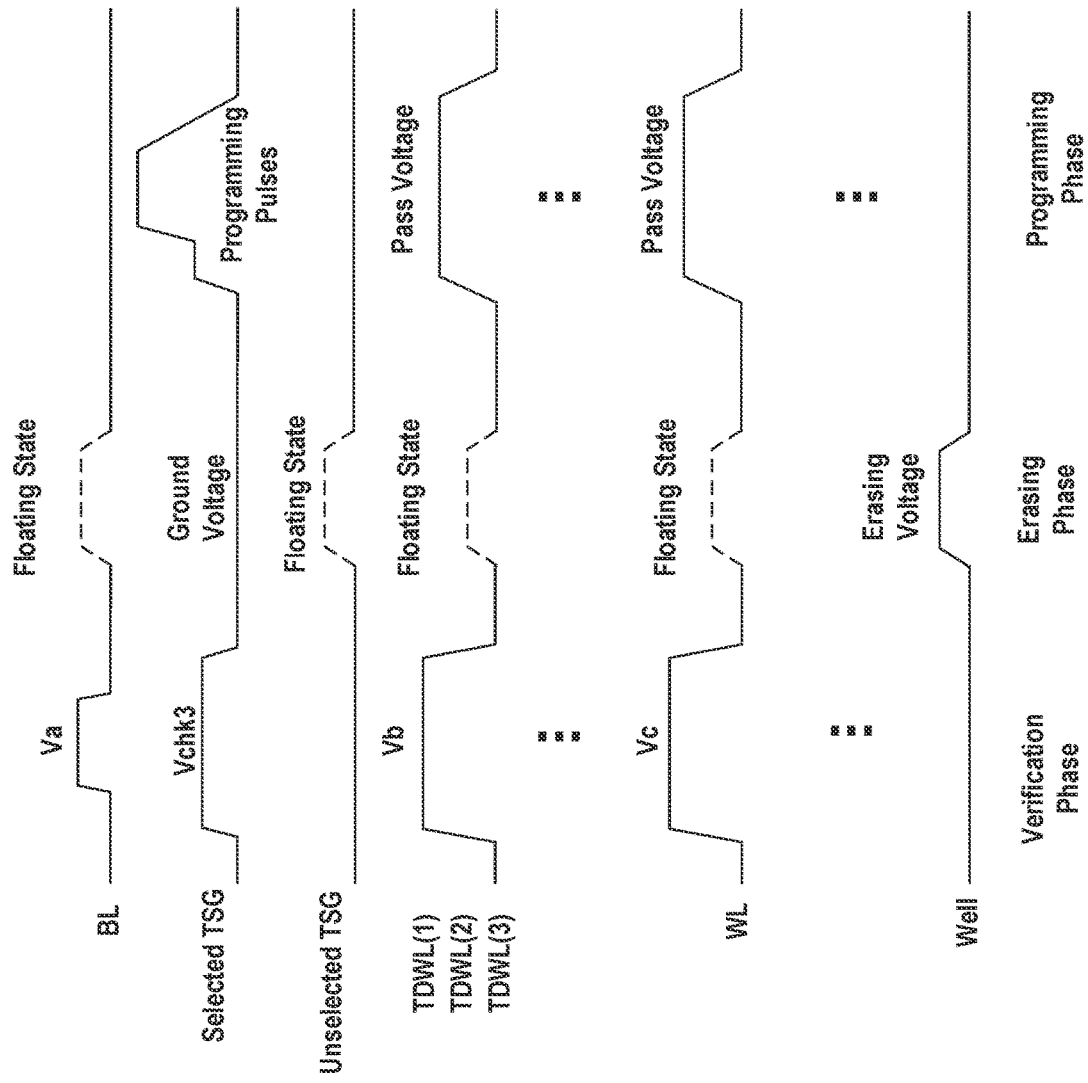
FIG. 8 illustrates a schematic diagram showing an exemplary voltage scheme in a combination of verification, erasing, and programming processes, according to some implementations of the present disclosure.

FIG. 8 illustrates a schematic diagram showing an exemplary voltage scheme in a combination of verification, erasing, and programming processes, according to some implementations of the present disclosure. As shown in FIG. 8, in some implementations, the verification, erasing, and programming processes may be performed sequentially. For example, at the verification phase, a verification voltage $V_{chk3}$ may be applied to a control terminal of one of the special memory cells (e.g., selected TSG in FIG. 8) for verifying the threshold voltage of the special memory cell, while one or more voltages may be applied to other electrical lines. For example, the bit line corresponding to the selected TSG may be triggered with a triggering voltage Va in the verification phase.

In response to the failure of the selected TSG in the verification phase, the peripheral circuit 12 may reset the selected TSG. As described above, in the erasing phase of the reset operation, the control terminal of the selected TSG may be grounded while an erasing voltage may be applied to the well (e.g., HVPW), and a portion of the special memory cells may be arranged in floating states, as shown in FIG. 8. Subsequently, in the programming phase, the selected TSG may be programmed by inputting one or more programming pulses sequentially (e.g., consecutively) into the control terminal of the selected TSG, while pass voltages may be applied to a portion of the special word lines and the main word lines. In some examples, the pass voltage applied to a special word line may be different from the pass voltage applied to a main word line. It can be understood that FIG. 8 merely shows a port of the electrical lines in the memory device as an illustrative example to describe the exemplary voltage scheme. Some of the other electrical lines may be omitted from FIG. 8.

In view of the above, the present disclosure introduces a solution in which once the threshold voltages are believed to be out of the suitable range. A reset operation may be performed to reset the special memory cells. As a result, the biasing operations can be relaxed, and the time to market may be accordingly reduced.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A memory device, comprising:
a string of cells comprising one and more top selection cells, one or more dummy memory cells, and memory cells; and
a peripheral circuit coupled to the string of cells and configured to, before or after erasing the memory cells:
verify whether a threshold voltage of at least one of the one or more top selection cells or the one or more dummy memory cells is out of verification bounds to determine whether the at least one of the one or more top selection cells or the one or more dummy memory cells has failed; and
in response to the at least one of the one or more top selection cells or the one or more dummy memory cells being failed, reset the at least one of the one or more top selection cells or the one or more dummy memory cells.

2. The memory device of claim 1, wherein the peripheral circuit is configured to adjust the threshold voltage of the at least one of the one or more top selection cells or the one or more dummy memory cells to be within the verification bounds.

3. The memory device of claim 1, wherein the peripheral circuit is configured to apply a verification voltage to a special word line corresponding to the at least one of the one or more top selection cells or the one or more dummy memory cells to verify the threshold voltage of the at least one of the one or more top selection cells or the one or more dummy memory cells, the verification voltage being lower than a voltage applied, in verifying the threshold voltage, to an unverified special memory cell at a same bit line.

4. The memory device of claim 1, wherein the peripheral circuit is configured to verify whether the at least one of the one or more top selection cells or the one or more dummy memory cells has failed prior to erasing the memory cells.

5. The memory device of claim 4, wherein the peripheral circuit is configured to:
determine whether the threshold voltage of the at least one of the one or more top selection cells or the one or more dummy memory cells is lower than a first verification level; and
in response to the threshold voltage of the at least one of the one or more top selection cells or the one or more dummy memory cells being lower than the first verification level, apply one or more program pulses to the at least one of the one or more top selection cells or the one or more dummy memory cells.

6. The memory device of claim 4, wherein the peripheral circuit is configured to:
determine whether the threshold voltage of the at least one of the one or more top selection cells or the one or more dummy memory cells is higher than a second verification level; and in response to the threshold voltage of the at least one of the one or more top selection cells or the one or more dummy memory cells being higher than the second verification level, perform a soft erasing operation on the at least one of the one or more top selection cells or the one or more dummy memory cells.

7. The memory device of claim 6, wherein, in the soft erasing operation, the peripheral circuit is configured to ground a control terminal of the at least one of the one or more top selection cells or the one or more dummy memory cells.

8. The memory device of claim 1, wherein the peripheral circuit is configured to verify whether the at least one of the one or more top selection cells or the one or more dummy memory cells has failed after erasing the memory cells.

9. The memory device of claim 8, wherein the peripheral circuit is further configured to:
erase the at least one of the one or more top selection cells or the one or more dummy memory cells; and
apply a program voltage to the at least one of the one or more top selection cells or the one or more dummy memory cells to reset the threshold voltage of the at least one of the one or more top selection cells or the one or more dummy memory cells.

10. The memory device of claim 9, wherein the peripheral circuit is configured to apply a pass voltage to the memory cells while applying the program voltage to the at least one of the one or more top selection cells or the one or more dummy memory cells.

11. The memory device of claim 1, wherein the memory device is a three-dimensional (3D) NAND Flash memory device.

12. The memory device of claim 1, wherein the one or more dummy memory cells comprise:
a plurality of dummy memory cells between the one or more top selection cells and a first portion of the memory cells;
a plurality of dummy memory cells between the first portion of the memory cells and a second portion of the memory cells; and
a plurality of dummy memory cells below the second portion of the memory cells.

13. A method for operating a memory device comprising a string of cells that comprises one or more top selection cells, one or more dummy memory cells, and memory cells, the method comprising:
erasing the memory cells; and
verifying a threshold voltage of at least one of the one or more top selection cells or the one or more dummy memory cells by applying a verification voltage to a control terminal of the at least one of the one or more top selection cells or the one or more dummy memory cells to determine whether the at least one of the one or more top selection cells or the one or more dummy memory cells has failed, wherein the verification voltage is lower than another voltage applied, in verifying the threshold voltage, to one of the memory cells at a same bit line.

14. The method of claim 13, further comprising:
in response to determining that the at least one of the one or more top selection cells or the one or more dummy memory cells has failed, erasing the at least one of the one or more top selection cells or the one or more dummy memory cells, and applying one or more programming pulses to the at least one of the one or more top selection cells or the one or more dummy memory cells to reset the at least one of the one or more top selection cells or the one or more dummy memory cells.

15. The memory device of claim 1, wherein the peripheral circuit is further configured to compare the threshold voltage of the at least one of the one or more top selection cells or the one or more dummy memory cells with a third verification level and a fourth verification level, respectively, the third verification level being lower than the fourth verification level.

16. The method of claim 13, further comprising:
adjusting the threshold voltage of the at least one of the one or more top selection cells or the one or more dummy memory cells to be within a verification range.

17. A method for operating a memory device comprising a string of cells that comprises one or more top selection cells, one or more dummy memory cells, and memory cells, the method comprising, before or after erasing the memory cells:
verifying whether a threshold voltage of at least one of the one or more top selection cells or the one or more dummy memory cells is out of verification bounds to determine whether the at least one of the one or more top selection cells or the one or more dummy memory cells has failed; and
in response to the at least one of the one or more top selection cells or the one or more dummy memory cells being failed, resetting the at least one of the one or more top selection cells or the one or more dummy memory cells.

18. The method of claim 17, wherein resetting the at least one of the one or more top selection cells or the one or more dummy memory cells comprises adjusting the threshold voltage of the at least one of the one or more top selection cells or the one or more dummy memory cells to be within the verification bounds.

19. The method of claim 17, further comprises:
applying a verification voltage to a special word line corresponding to the at least one of the one or more top selection cells or the one or more dummy memory cells to verify the threshold voltage of the at least one of the one or more top selection cells or the one or more dummy memory cells, the verification voltage being lower than a voltage applied, in verifying the threshold voltage, to an unverified special memory cell at a same bit line.

20. The method of claim 17, further comprising at least one of:
verifying whether the at least one of the one or more top selection cells or the one or more dummy memory cells has failed prior to erasing the memory cells; or
verifying whether the at least one of the one or more top selection cells or the one or more dummy memory cells has failed after erasing the memory cells.

* * * * *